(12) United States Patent
Gilles et al.

(10) Patent No.: US 6,493,059 B1
(45) Date of Patent: Dec. 10, 2002

(54) INSTALLATION FOR EXPOSING A DOUBLE-SIDED PRINTED CIRCUIT CARD TO LIGHT

(75) Inventors: Hervé Gilles, Amfreville les Champs (FR); Arnaud Leboucher, Rouen (FR)

(73) Assignee: Automa-Tech, Val de Reuix (FR)

( * ) Notice: Subject to any disclaimer, the term of this patent is extended or adjusted under 35 U.S.C. 154(b) by 3 days.

(21) Appl. No.: 09/611,546

(22) Filed: Jul. 7, 2000

(30) Foreign Application Priority Data

Jul. 8, 1999 (FR) ............................................. 99 08836

(51) Int. Cl.[7] ...................... G03B 27/32; G03B 27/04; G01B 11/00
(52) U.S. Cl. ........................ 355/23; 355/95; 356/401
(58) Field of Search ............................ 355/23, 95, 72, 355/75, 26, 73, 91; 356/401, 399, 400; 250/491.1; 430/5

(56) References Cited

U.S. PATENT DOCUMENTS 5,880,820 A * 3/1999 Sorel et al. .................. 355/95

FOREIGN PATENT DOCUMENTS

| DE | 38 36 888 | 5/1990 |
|----|-----------|--------|
| EP | 0 807 855 | 11/1997 |

* cited by examiner

Primary Examiner—Russell Adams
Assistant Examiner—Peter B. Kim
(74) Attorney, Agent, or Firm—O'Melveny & Myers LLP

(57) ABSTRACT

The invention relates to an installation for exposing a double-sided printed circuit card to light through artworks. The installation comprises a first artwork-support (10) that is fixed, a second artwork (14) that is movable, vertical displacement means (26, 28) for moving the second support, and mechanical connection means between the displacement means and the second support, the first and second supports having relative positioning members (12, 24) suitable for mutual co-operation when the two supports are in the working position. The mechanical connection means comprise a first horizontal connection surface (42, 44) mechanically connected (38, 40, 46, 48) to the vertical displacement means, a second horizontal connection surface (20, 22) secured to the second support, support means (50) for establishing substantially frictionless co-operation between the first and second connection surfaces (42, 44; 20, 22), and controllable locking means (50) for temporarily locking the first and second connection surfaces together.

14 Claims, 4 Drawing Sheets

INSTALLATION FOR EXPOSING A DOUBLE-SIDED PRINTED CIRCUIT CARD TO LIGHT

The present invention relates to an installation for exposing a double-sided printed circuit card to light.

Amongst the operations required in making a printed circuit card, there is a step of insolation, in particular for defining the conductor tracks of the printed circuit by photoetching. The function of the corresponding installation is to take the printed circuits covered in a film or in a photosensitive resist and to expose them to ultraviolet light for a given length of time through an artwork so as to insolate the corresponding portion of the photosensitive film or resist.

The installation in question is of the type in which the printed circuit is a double-sided printed circuit, i.e. conductive tracks need to be made on both faces of the insulating medium of the printed circuit card, with both faces being made simultaneously.

Consequently, in such an installation, there is a top artwork support and a bottom artwork support, and the card whose two faces are to be insolated is placed between them. To enable the card for insolation to be put into place, it is necessary to be able to move the top artwork support away from the bottom support. These artwork supports are mounted on frames, and the top support is thus associated with a top frame which must be driven with up and down motion.

Such installations are described in particular in European patent applications EP 0 618 505 and EP 0 807 855 in the name of the Applicant.

When the top artwork frame reaches its bottom position, it is accurately positioned relative to the bottom frame by the presence of male and female centering cones. It is necessary for this operation to be repeatable with high accuracy, to within about 5 microns.

When the printed circuit cards to be made, i.e. to be insolated on both faces, are of relatively small dimensions, then it is relatively easy to achieve co-operation between the male and female cones of the moving top frame and of the stationary bottom frame. However, with printed circuit cards of greater dimensions, it is necessary to provide a machine which is itself of greater dimensions and which has a top frame of much greater dimensions and consequently of much greater weight, e.g. 250 kg, in order to obtain stiffness matching the precision of the installation. Under such circumstances, while the top frame is being lowered relative to the bottom frame, co-operation between the male and female cones of the top frame and of the bottom frame gives rise to a certain number of difficulties, in particular due to problems of friction between the male and female cones.

An object of the present invention is to provide an installation for exposing a double-sided printed circuit card to light through artworks, in which the co-operation between the male and female cones of the top frame carrying the top artwork and the bottom frame can be obtained easily in spite of the considerable weight of the moving top frame.

According to the invention, this is achieved by an installation for exposing a double-sided printed circuit card to light through artworks, the installation comprising a structure, a first artwork-support frame fixed relative to the structure, a second artwork-support frame movable relative to the structure, vertical displacement means for displacing said second frame between a waiting position and a working position in which the two frames are close to each other, and mechanical link means between the displacement means and said second frame, the first and second frames having relative positioning members suitable for mutual co-operation when the two frames are in the working position, the installation being characterized in that the mechanical connection means comprise:

first means forming a first horizontal connection surface mechanically connected to the vertical displacement means;

means forming a second horizontal connection surface secured to said second frame;

support means for providing substantially frictionless co-operation in a horizontal plane between said first and second connection surfaces, thereby enabling said second frame to move horizontally relative to the structure; and controllable locking means for temporarily locking said first and second support surfaces together.

It will be understood that by connecting the frame in this way to the means for displacing the frame vertically, it is possible to obtain co-operation between the male and female positioning cones without giving rise to high stresses. However, outside the final stage of co-operation between the cones, the controllable locking means serve to ensure a rigid connection between the displacement means and the frame of the top artwork support.

Preferably, pneumatic means controllable in vertical displacement are interposed between the frictionless co-operation means and the displacement means in order to drive vertical relative displacement between the top frame and the vertical displacement means. This disposition makes it possible to "lighten" or reduce the apparent weight of the top frame carrying the top artwork support so as to provide a safety function for the personnel using the machine. It is recalled that the top frame assembly can weigh about 250 kg. This disposition also makes it possible to lighten the top frame at the moment when it comes into contact with the bottom frame. It is thus possible to limit the stresses applied to the bottom frame while this contact is being made. Nevertheless, when the top frame comes into contact with the bottom frame, it is necessary for the apparent weight of the frame to be sufficient to overcome the force developed by the inflatable gasket which is provided on the bottom frame so as to be able to evacuate between the two frames.

Also preferably, the substantially frictionless co-operation means comprise balls which are interposed between the first and second horizontal connection surfaces.

Other characteristics and advantages of the invention will appear better on reading the following description of a preferred embodiment of the invention given by way of non-limiting example. The description refers to the accompanying figures, in which.

Figure 1:
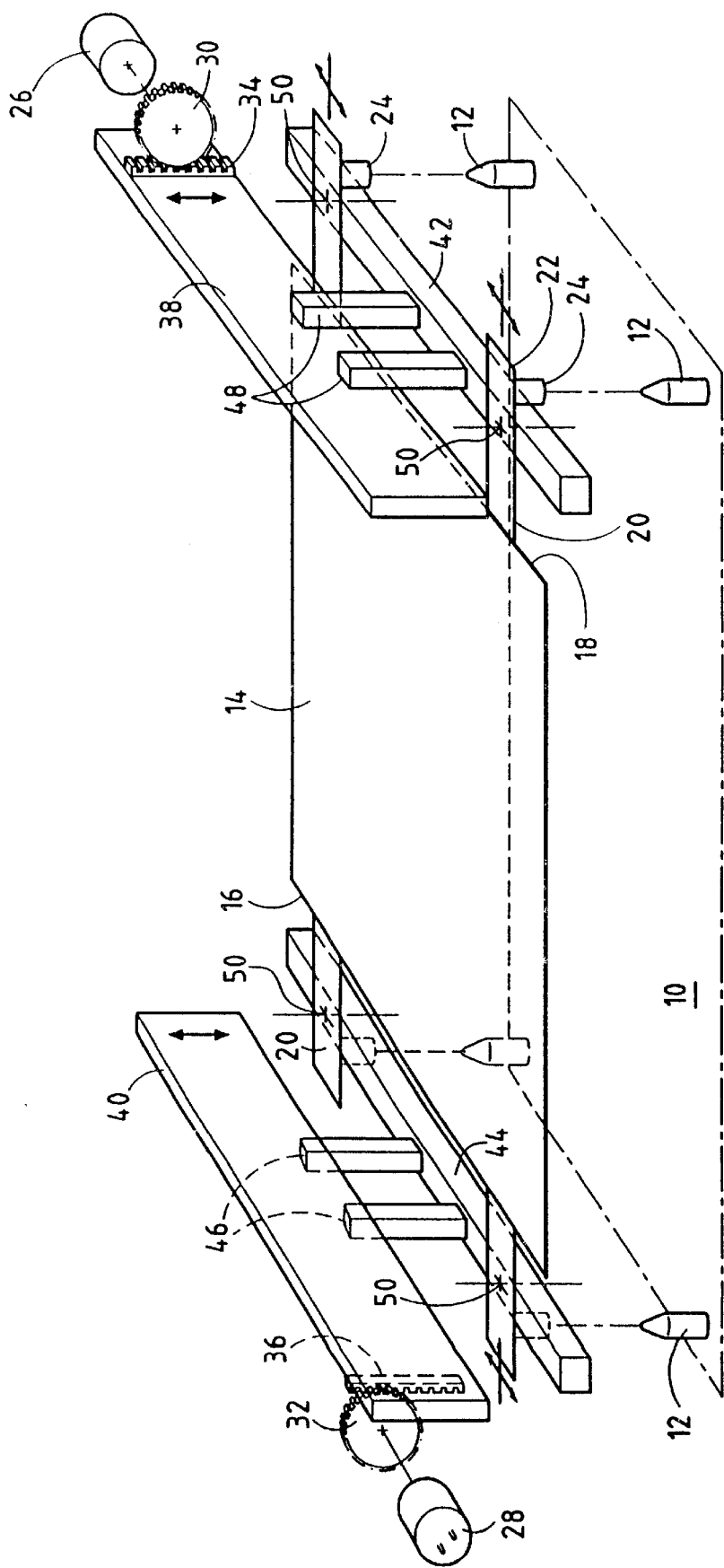
FIG. 1 is a diagrammatic perspective view showing the connection between the displacement means and the top frame.

With reference initially more specifically to FIG. 1, the essential characteristics of the exposure installation of the invention are described.

In this figure, there is shown in simplified manner the bottom frame 10 which is provided with male positioning cones 12. This figure also shows the top frame 14 which is provided at each of its longitudinal ends 16 and 18 with a pair of lugs such as 20 projecting out from the top frame 14. The end 22 of each lug 20 carries a female centering cone 24 that is to co-operate with a male cone 12 of the bottom frame 10. Since the lugs 20 are connected rigidly to the frame 14, the female cones 24 are likewise rigidly connected to the top frame 14 and thus enable it to be positioned accurately relative to the bottom frame 10 when the cones 24 and 12 co-operate.

The top frame 14 is connected to vertical displacement means via the lugs 20. More precisely, these displacement means comprise two motor-and-gear-box units 26 and 28 which are mounted on the structure of the machine (not shown in FIG. 1). The outlets from the units 26, 28 are coupled to respective pinions 30 and 32 which co-operate with respective racks 34 and 36 provided on respective support plates 38 and 40 disposed at opposite longitudinal ends of the top frame 14. The plates 38 and 40 can thus be moved vertically in synchronized manner by means of the units 26 and 28 and the rack-and-pinion systems. The mechanical connection between the displacement means and the top frame 14 also include beams 42 and 44 disposed parallel to the plates 38 and 40. The beams 42 and 44 are connected to the plates 38 and 40 via two sets of pneumatic actuators 48 and 46 which are described in greater detail below. It suffices to mention that these actuators serve to obtain controllable relative displacement between the beams 42, 44 and the plates 38, 40.

Each end 22 of a lug 20 of the top frame 14 is connected to the corresponding beam 42 or 44 via a system 50 for frictionless support and for temporary locking. In other words, when the temporary locking means are not activated, then the lugs 20 and thus the top frame 14, can move freely in a horizontal plane relative to the beams 42 and 44, i.e. relative to the vertical displacement means for displacing the top frame 14. The frictionless support and locking systems 50 are described in greater detail below.

There follows a description of the way in which the insolation installation operates concerning positioning the top frame 14 relative to the bottom frame 10. During the initial stage of lowering the frame 14, the locking systems 50 are activated. The top frame 14 is thus rigidly connected to the means for displacing the frame 14 vertically. When the centering cones 24 of the top frame come into the immediate vicinity of the male cones 12 of the bottom frame 10, the locking means of the systems 50 are released so that the top frame 14 can move freely in the horizontal plane relative to the vertical displacement means. Thus, while terminating lowering of the top frame 14, final co-operation between the centering cones is obtained without inducing stresses in the mechanical system, and very high precision is obtained in relative positioning.

It should be added that during the lowering stage, the pneumatic actuators 46 are activated so as to reduce the apparent weight of the top frame 14 so as to lighten the top frame 14 relative to the displacement means. It is only once positioning has been achieved that the actuators 46 are activated so as to confer sufficient relative weight to the top frame.

Figure 2:
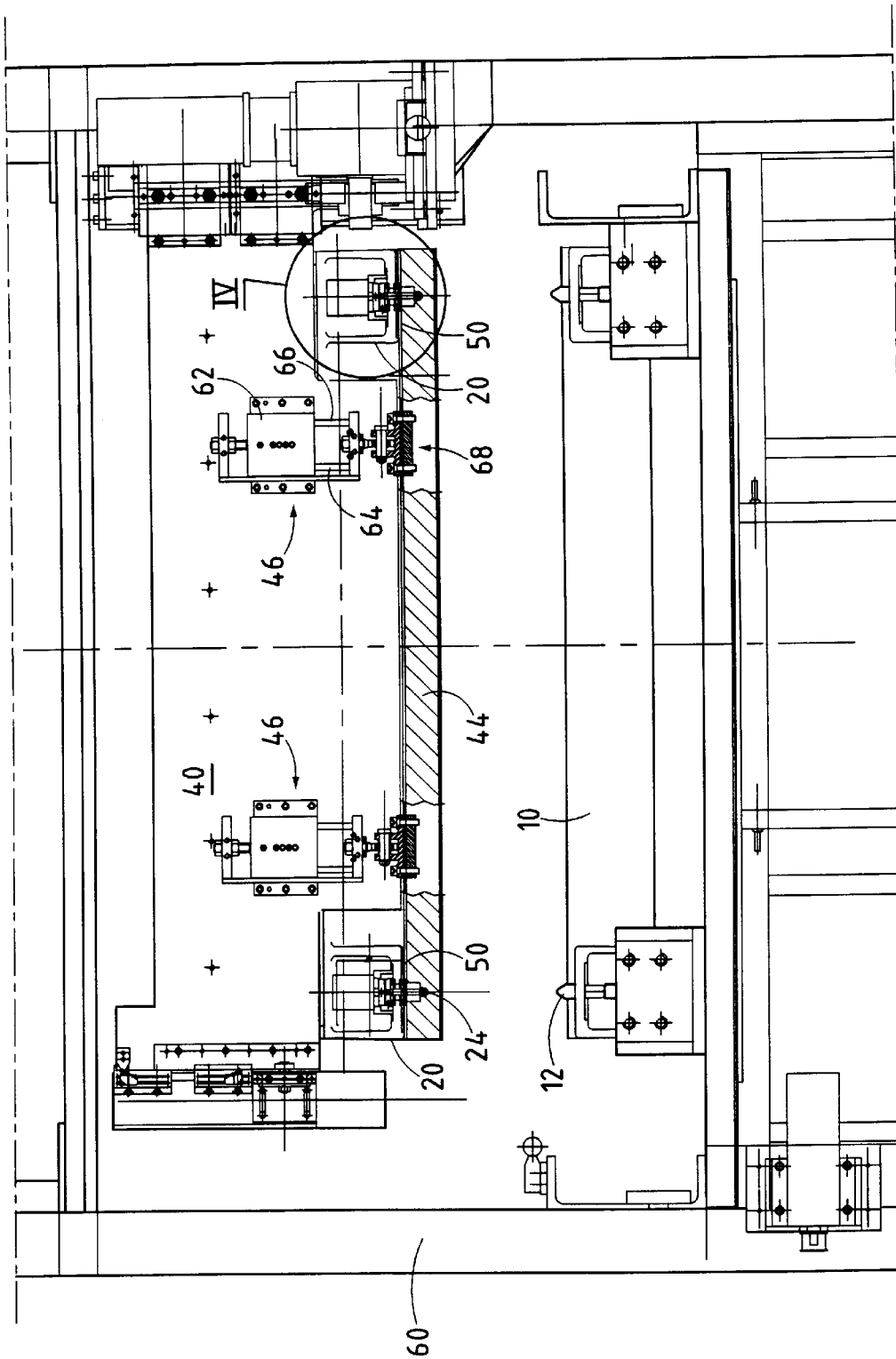
FIG. 2 is a detailed elevation view partially in section showing the exposure machine as a whole.
Figure 3:
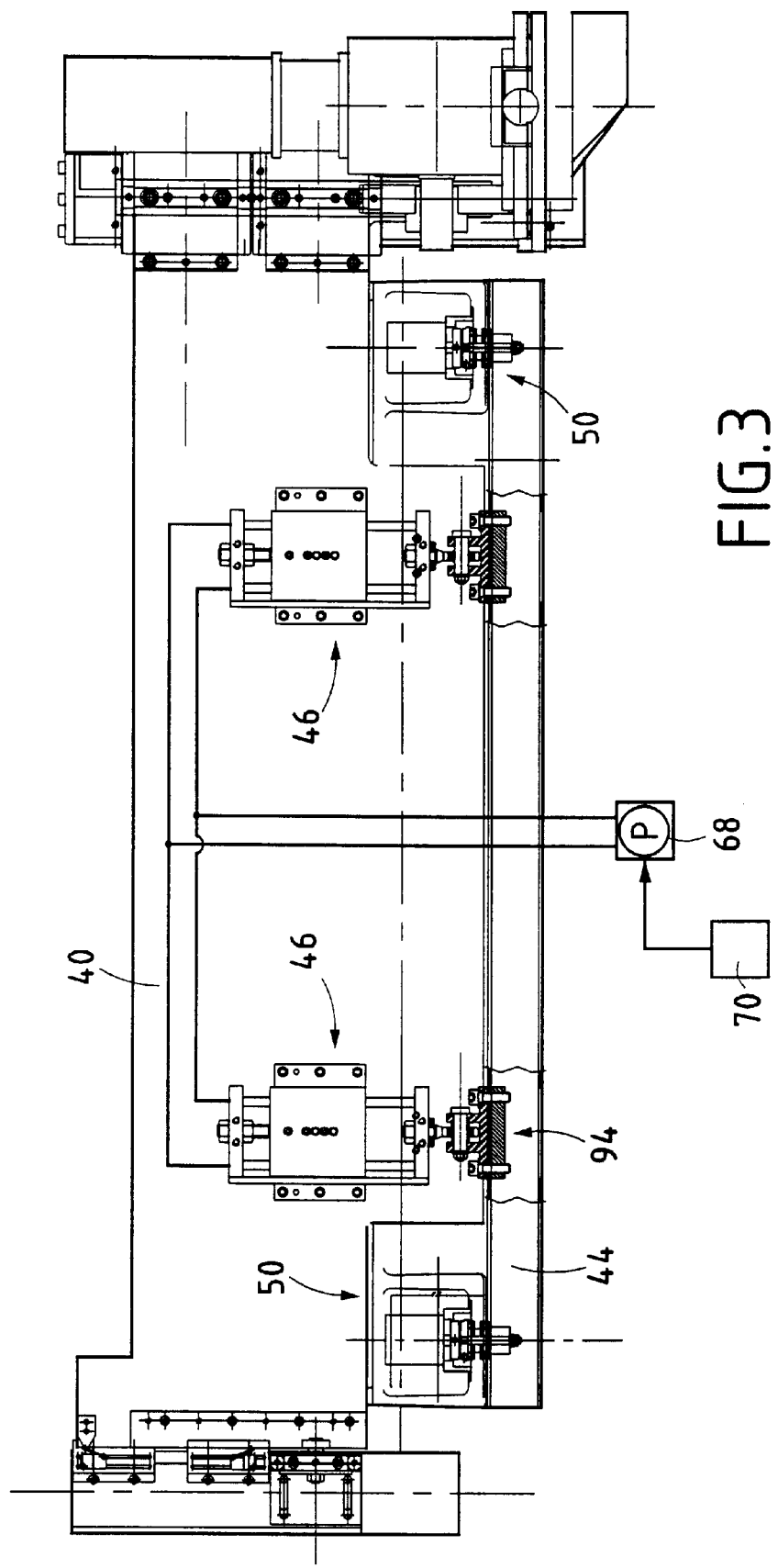
FIG. 3 is a view showing a fragment of FIG. 2.

FIGS. 2 and 3 show the various members that are described above with reference to FIG. 1, but in greater detail. These figures show in particular the overall structure 60 of the machine which supports the bottom frame 12 and which provides vertical guidance for the displacement of the plates 38 and 40. These figures also show the actuators 46 in greater detail. Each actuator preferably comprises a single cylinder 62 controlling the displacement of two parallel actuator rods 64 and 66. The ends of the rods 64 and 66 are coupled to the beam 44 by a connection system which is described below with reference to FIG. 5.

FIG. 3 also shows the pressure regulator 68 which is connected to the actuator 46. The regulator 68 is associated with a control circuit 70 which enables the pressure applied to the actuator to be controlled so as to cause the top frame to be "lightened" or on the contrary so as to cause it to be applied with pressure against the bottom frame.

Figure 4:
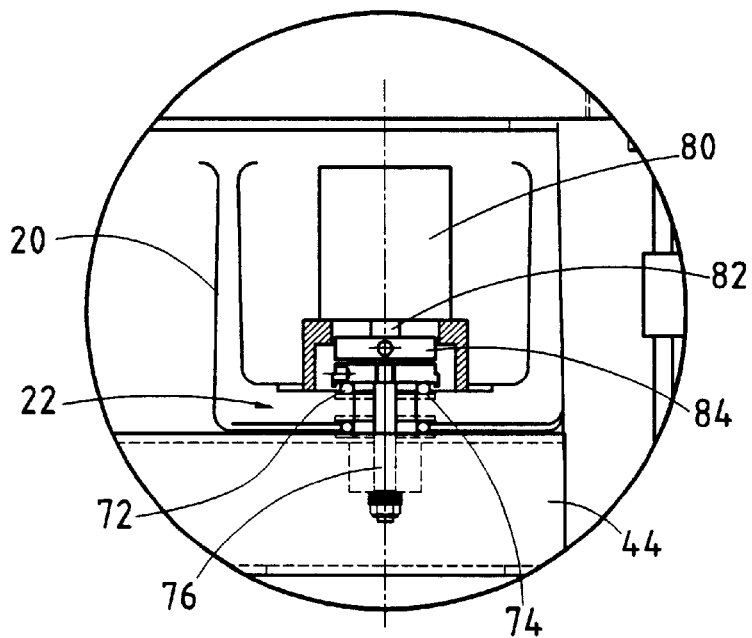
FIG. 4 is a detail view showing how the frictionless support and locking of the top frame is implemented relative to the displacement means.

FIG. 4 shows in greater detail the mechanical connection between a lug 20 of the top frame and the beam 44 via the system 50 for frictionless support and locking. The support system 50 is essentially constituted by balls such as 72 which are disposed in a cage, the first element of the cage being a plane horizontal surface 74 provided in the lug 20 and the other elements being constituted by a likewise horizontal plate 75 which is connected to the beam 44 by a rod 76 that passes freely through the lug 20. The lug 20 can thus move freely and without friction relative to the beam 44 in a horizontal plane. To lock the top frame 14 relative to the beam 44, i.e. to prevent them from moving relative to each other, an actuator 80 is provided secured to the lug 20 and having its rod 82 terminated by a plate 84 facing the plate 74 of the ball system. It will be understood that by actuating the actuator 80, the plate 84 is pressed against the top plate 74, thereby preventing the balls from moving, and thus establishing a rigid connection between the top frame and the beam 44.

Figure 5:
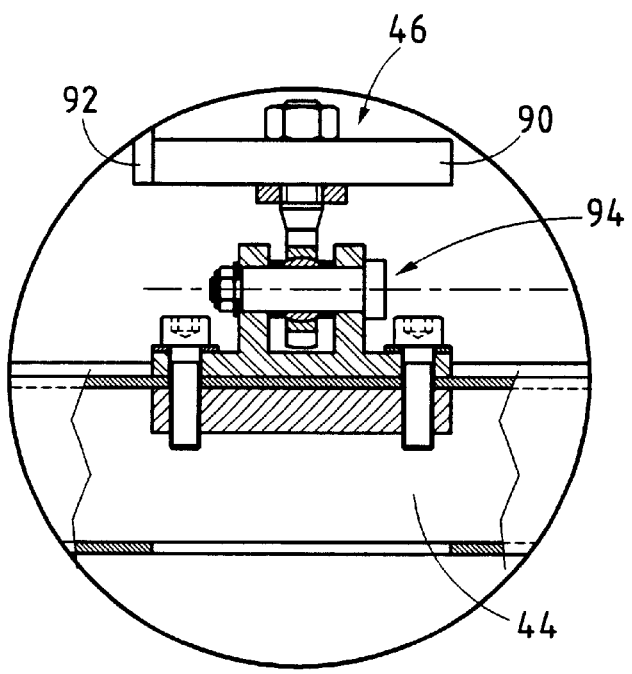
FIG. 5 is a detail view showing co-operation between the pneumatic means and the elements for vertically displacing the top frame.

FIG. 5 shows a preferred embodiment of the mechanical connection between the rods of the actuators 46 secured to the plate 38 and the beam 42. This connection comprises a bar 90 secured to the bottom ends of the rods of the actuator 46. This bar 90 is connected to the beam 44 via a hinged connection 94 about a hinge axis parallel to the beam 44.

What is claimed is:

1. An apparatus for exposing a double-sided printed circuit board to light through an artwork, the apparatus comprising:

a structure;

a first artwork-support frame fixed relative to the structure at all times during a production cycle and defining a horizontal mounting plane;

a vertical drive mechanism disposed over the first frame, comprising a mounting surface attached to a vertically movable driver, the vertically movable driver immobile in directions parallel to the horizontal mounting plane;

a second artwork-support frame movable in all directions mounted to the mounting surface;

a plurality of bearings vertically supporting the second frame on the mounting surface, whereby substantially frictionless movement of the second frame in a plane parallel to the horizontal mounting plane is permitted during vertical movement of the second frame; and alignment features disposed on the first frame and the second frame, each alignment feature comprising a pair of members configured to cooperate in mating relationship to align the second frame relative to the first frame in directions parallel to the horizontal mounting plane when the second frame is moved towards the first frame, a first member of the pair mounted to the first frame, and a second member of the pair mounted to the second frame.

2. The apparatus according to claim 1, wherein the mounting surface is connected to the vertically movable driver by vertical actuators configured to vertically move the mounting surface independently of the vertically movable driver.

3. The apparatus according to claim 1, wherein the vertical actuators comprise a plurality of pneumatic actuators having first ends secured to the vertically movable driver and second ends secured to a beam supporting the horizontal mounting surface.

4. The apparatus according to claim 1, wherein the mounting surface is connected to the vertically movable driver by a plurality of hinged connections.

5. The apparatus according to claim 1, wherein the mounting surface is suspended from the vertically movable driver by a plurality of pivoting links.

6. The apparatus according to claim 1, wherein the each of the plurality of bearings comprises a ball bearing.

7. The apparatus according to claim 1, wherein the alignment features comprise centering cones.

8. The apparatus according to claim 1, further comprising a lock mechanism connected to the mounting surface for preventing movement of the second frame in a plane parallel to the horizontal mounting plane when the lock mechanism is activated.

9. The apparatus according to claim 8, wherein the lock mechanism comprises a plurality of independently operable bearing locks, each of the bearing locks attached to one of the plurality of bearings.

10. The apparatus according to claim 9, wherein each of the bearing locks comprises a pneumatic cylinder configured to compress one of the plurality of bearings when the lock mechanism is activated.

11. An apparatus for exposing a double-sided printed circuit board to light through an artwork, the apparatus comprising:

a structure;

a first artwork-support frame fixed relative to the structure at all times during a production cycle and defining a horizontal mounting plane;

a vertical drive means disposed over the first frame, for vertically moving a mounting surface attached to a vertically movable driver, the vertically movable driver immobile in directions parallel to the horizontal mounting plane;

a second artwork-support frame movable in all directions mounted to the mounting surface;

bearing means vertically supporting the second frame on the mounting surface, whereby substantially frictionless movement of the second frame in a plane parallel to the horizontal mounting plane is permitted during vertical movement of the second frame; and alignment means disposed on the first frame and the second frame, for passively aligning the second frame relative to the first frame in directions parallel to the horizontal mounting plane by moving the second frame vertically towards the first frame with the vertical drive means.

12. The apparatus according to claim 11, wherein the mounting surface is connected to the vertically movable driver by vertical actuating means for vertically moving the mounting surface independently of the vertically movable driver.

13. The apparatus according to claim 11, further comprising means for suspending the mounting surface in hinged relation from the vertically movable driver.

14. The apparatus according to claim 11, further comprising locking means connected to the mounting surface for preventing movement of the second frame in a plane parallel to the horizontal mounting plane when the locking means is activated.

\* \* \* \* \*